US012660114B2

(12) United States Patent
Tsorng et al.

(10) Patent No.: US 12,660,114 B2
(45) Date of Patent: Jun. 16, 2026

(54) ADJUSTABLE LEVER FOR SERVER CHASSIS AND SERVER HAVING SAME

(71) Applicant: Quanta Computer Inc., Taoyuan City (TW)

(72) Inventors: Yaw-Tzorng Tsorng, Taoyuan City (TW); Ming-Lung Wang, Taoyuan City (TW); Hung-Wei Chen, Taoyuan City (TW); Li-Yang Huang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 106 days.

(21) Appl. No.: 18/898,290

(22) Filed: Sep. 26, 2024

(65) Prior Publication Data

US 2026/0032842 A1      Jan. 29, 2026

Related U.S. Application Data

(60) Provisional application No. 63/674,488, filed on Jul. 23, 2024.

(51) Int. Cl.
*H05K 7/14* (2006.01)
(52) U.S. Cl.
CPC ......... *H05K 7/1409* (2013.01); *H05K 7/1488* (2013.01)

(58) Field of Classification Search
CPC ........................... H05K 7/1409; H05K 7/1488
USPC ...................................... 361/759, 801
See application file for complete search history.

(56) References Cited

U.S. PATENT DOCUMENTS

| | | | | |
|---|---|---|---|---|
| 9,788,454 | B1 * | 10/2017 | Leung .................. | H05K 7/1411 |
| 9,854,695 | B1 * | 12/2017 | Prabhakar ............ | H05K 7/1487 |
| 2010/0271766 | A1 * | 10/2010 | Lin ......................... | G06F 1/184 |
| | | | | 361/679.48 |
| 2023/0058481 | A1 * | 2/2023 | Li ...................... | H05K 7/20736 |

* cited by examiner

*Primary Examiner* — Hung S. Bui
(74) *Attorney, Agent, or Firm* — NIXON PEABODY LLP

(57) ABSTRACT

A server and a server chassis are disclosed. The server chassis includes a base having at least two partitions and two levers mounted to the base. The server includes the server chassis. The base is configured to receive a server module between the at least two partitions. The two levers are configured to be coupled with or uncoupled from the at least two partitions. At least one of the two levers includes an adjustable arm having a first arm and a second arm. The second arm is movably coupled to the first arm. The second arm is slidingly movable with respect to the first arm. The adjustable arm has a length that is changeable based on a position of the second arm relative to the first arm, i.e., based on relative movement between the first arm and the second arm.

20 Claims, 14 Drawing Sheets

200

X

132

Y

131

Z

ADJUSTABLE LEVER FOR SERVER CHASSIS AND SERVER HAVING SAME

CROSS-REFERENCE TO RELATED APPLICATIONS

This application claims priority from and benefit of U.S. Provisional Patent Application Ser. No. 63/674,488, filed on Jul. 23, 2024, titled "ADJUSTABLE LEVER DESIGN FOR SERVERS," which is hereby incorporated by reference herein in its entirety.

FIELD OF THE INVENTION

The present invention relates generally to a server chassis, and more specifically, to a server chassis with an adjustable lever for securing various types of server modules therein.

BACKGROUND OF THE INVENTION

In general, servers are characterized by a modular design. Servers can be adapted to meet user needs by including various modules. Sometimes, front panel modules of servers are replaced with different front panel modules based on the needs of the user. Generally, levers are installed on the server chassis to secure the front panel modules therein. Prior art levers have hook structures that are configured to couple with hook-connecting structures of the front panel modules. However, the prior art levers are not adjustable, and therefore cannot be used to couple with hook-connecting structures if the front panel modules are replaced with different front panel modules. That is because the replaced front panel modules may have different dimensions compared to the dimensions of the previously installed front panel modules. Thus, positions of hook-connecting structures may change when the front panel modules are replaced with different front panel modules. Due to the changed positions of the replaced front panel modules, the existing levers may not be used. For that reason, the existing levers also need to be replaced with different levers that can be coupled with the replaced front panel modules having hook-connecting structures at different positions. Therefore, replacing both the front panel modules and levers increase the overall costs of servers.

Therefore, a need exists for solving the above and other problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a server chassis includes a base having at least two partitions and two levers mounted to the base. The base is configured to receive a server module between the at least two partitions. The two levers are configured to be coupled with or uncoupled from the at least two partitions. At least one of the two levers includes an adjustable arm having a first arm and a second arm. The second arm is movably coupled to the first arm. The adjustable arm has a length that is changeable based on a position of the second arm relative to the first arm.

In some embodiments, the base includes a first side wall and a second side wall that is parallel to the first side wall. The at least two partitions are positioned between the first side wall and the second side wall. One of the two levers is coupled to the first side wall, and another one of the two levers is coupled to the second side wall.

In some embodiments, the at least one of the two levers further includes a lever base coupled to the first or second side wall of the base and a hook structure coupled to the second arm. The first arm is coupled to the lever base.

In some embodiments, the lever base includes a fixed portion coupled to the first or second side wall of the base. In some embodiments, the lever base further includes a movable portion pivotably coupled to the fixed portion. The first arm is coupled to the movable portion, and the adjustable arm and the movable portion move together.

In some embodiments, the lever base further includes a tab extending from the movable portion. The tab is configured to receive a user input for moving the adjustable arm. The two levers are engaged with or disengaged from respective partitions in response to the movement of the adjustable arm.

In some embodiments, the hook structure is pivotably coupled to the second arm.

In some embodiments, the hook structure is configured to engage with a receiving portion of a corresponding one of the at least two partitions.

In some embodiments, a distance between the at least two partitions is changeable to accommodate the server module received in the base based on a width of the server module.

In some embodiments, the distance is a first distance when the server module is a first type server module, and the distance is a second distance when the server module is a second type server module. The first distance is greater than the second distance. The first type server module has a different size than the second type server module.

In some embodiments, the at least one of the two levers is set in a first configuration when the two levers are coupled with the at least two partitions and when the distance is the first distance.

In some embodiments, the second arm is positioned at a first position with respect to the first arm when the at least one of the two levers is set in the first configuration.

In some embodiments, the at least one of the two levers is set in a second configuration when the two levers are coupled with the at least two partitions and when the distance is the second distance.

In some embodiments, the second arm is positioned at a second position with respect to the first arm when the at least one of the two levers is set in the second configuration.

In some embodiments, a first length of the at least one of the two levers set in the first configuration is shorter than a second length of the at least one of the two levers set in the second configuration.

According to certain aspects of the present disclosure, a server is disclosed. The server includes a base having at least two partitions. The base is configured to receive a server module between the at least two partitions. A distance between the at least two partitions is a first distance when the server module is a first type server module, and the distance is a second distance when the server module is a second type server module. The first distance is greater than the second distance. The server further includes two levers coupled to the base. The two levers are configured to be coupled with or uncoupled from the at least two partitions. Each of the at least two partitions has a receiving portion configured to engage with a hook structure of a corresponding one of the two levers. At least one of the two levers includes an adjustable arm having a first arm and a second arm. The adjustable arm further has a slit. At least two fasteners pass through the slit and couple the second arm to the first arm. The second arm is slidingly movable with respect to the first arm. A length of the adjustable arm is changeable based on relative movement between the first arm and the second arm.

In some embodiments, the at least one of the two levers is set in a first configuration when the two levers are coupled with the at least two partitions and when the distance is the first distance.

In some embodiments, the second arm is positioned at a first position with respect to the first arm when the at least one of the two levers is set in the first configuration.

In some embodiments, the at least one of the two levers is set in a second configuration when the two levers are coupled with the at least two partitions and when the distance is the second distance.

In some embodiments, the second arm is positioned at a second position with respect to the first arm when the at least one of the two levers is set in the second configuration. A first length of the at least one of the two levers set in the first configuration is shorter than a second length of the at least one of the two levers set in the second configuration.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 7F is a magnified top view of area A shown in FIG. 7E, and FIG. 7H is a magnified top view of area B shown in FIG. 7G.

Figure 1A:
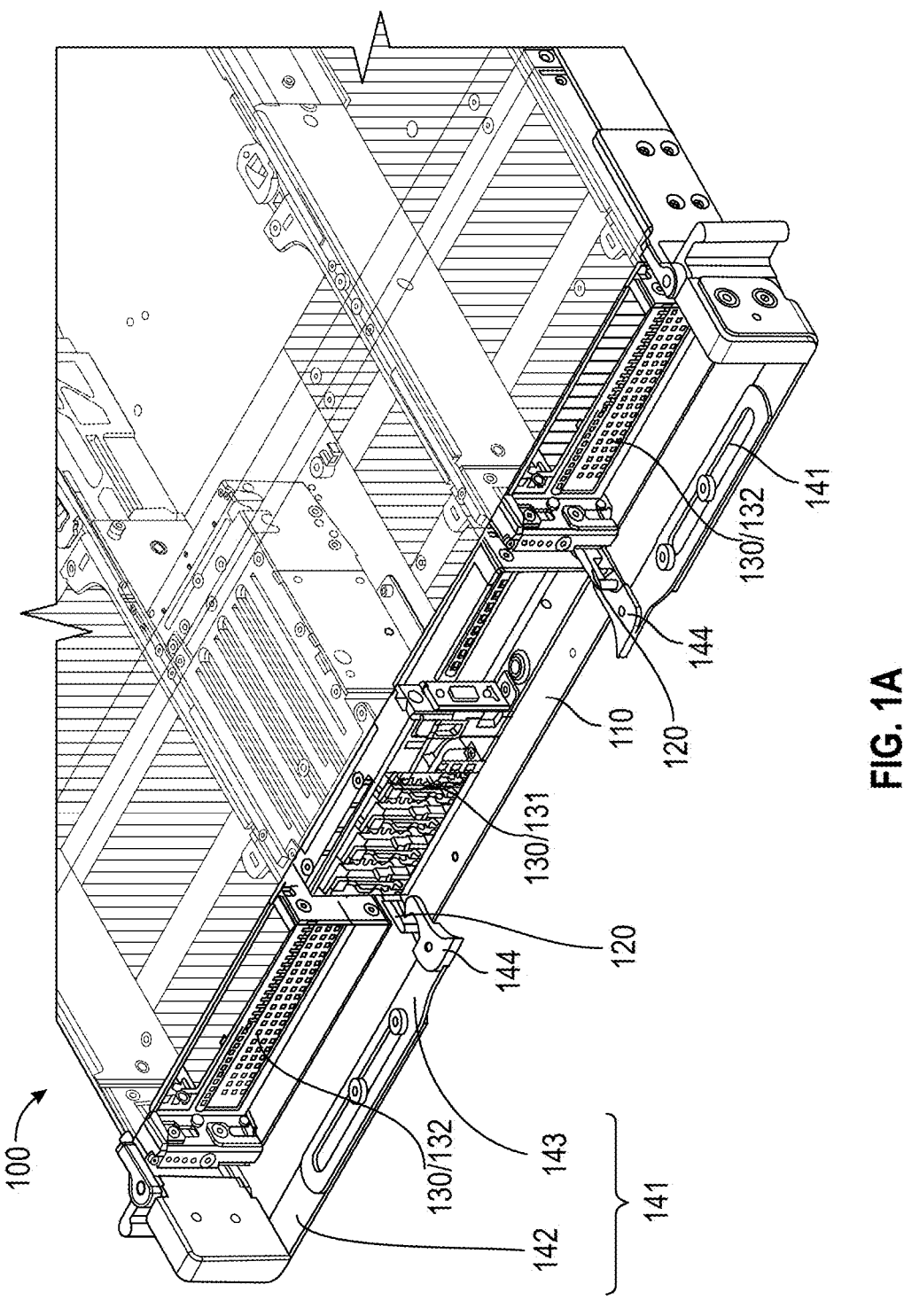
FIG. 1A is a generally perspective partial view of a server chassis housing various components, according to certain aspects of the present disclosure.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

The present disclosure relates to a server chassis with adjustable levers configured to engage with respectively corresponding partitions. The server chassis includes a base having the partitions, and a server module is received between the partitions. By receiving the server module between the partitions and having the levers engage with the partitions, the server module received within the server chassis is secured. If the existing server module is replaced with a new server module having a different dimension or width, the arrangement of partitions may be adjusted to accommodate the new server module. Further, by adjusting the length of the levers, the levers can engage with the newly arranged partitions. Therefore, the same levers can be used without being replaced when the server module installed within the server chassis is replaced with a different type of server module having a different dimension. For example, the server chassis of the present disclosure can be applied to drawer-based servers equipped with levers.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
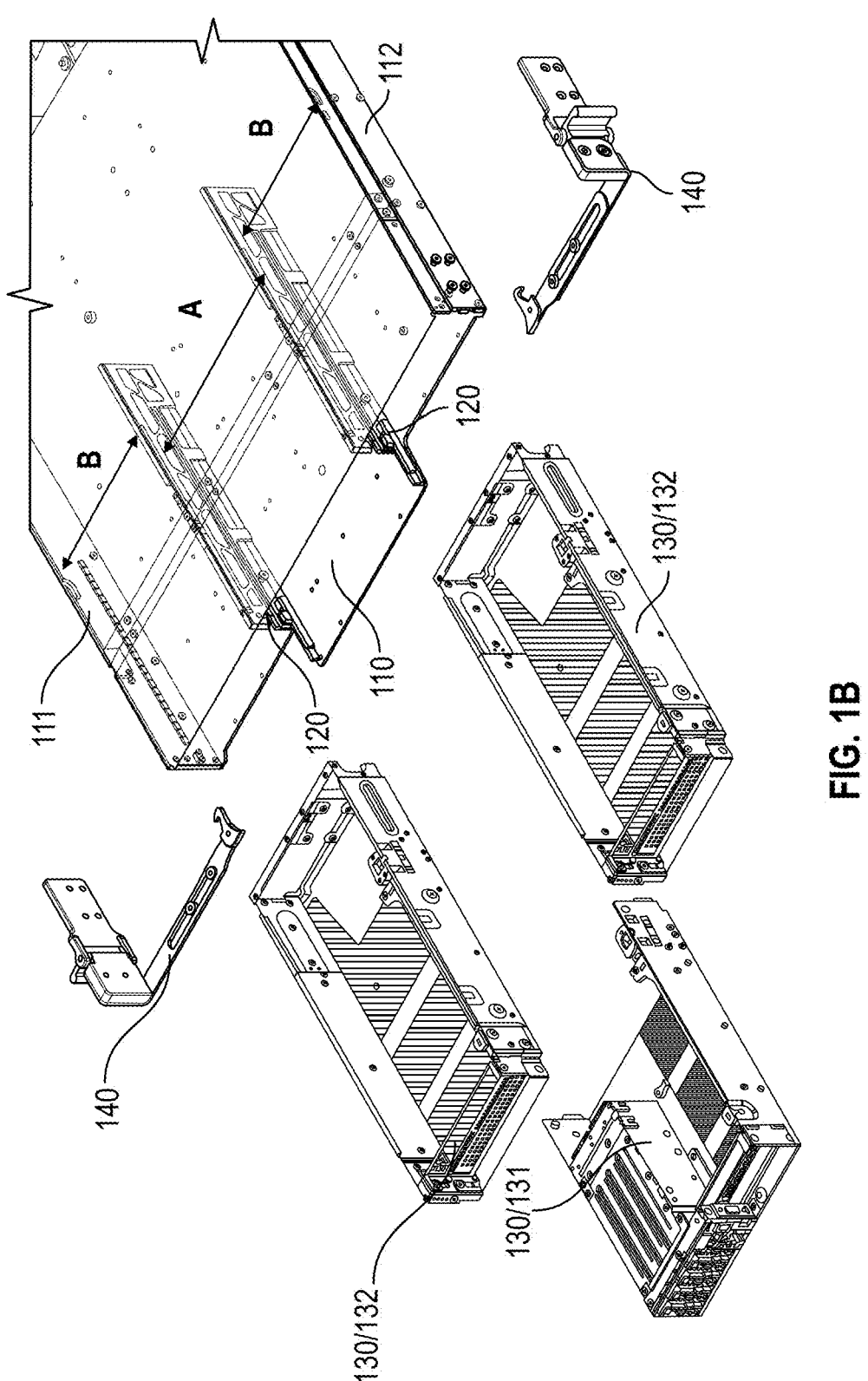
FIG. 1B is an exploded view of the server chassis and various components shown in FIG. 1A, according to certain aspects of the present disclosure.

Referring to FIGS. 1A and 1B, a server chassis 100 has at least one server module 130 installed therein. For example, as illustrated specifically in FIGS. 1A and 1B, the at least one server module 130 includes a first type server module 131 and two second type server modules 132 that are installed within the server chassis 100. The first type server module 131 has a first width and each of the second type server modules 132 has a second width. The first width is different than the second width.

The server chassis 100 further includes a base 110 having at least two partitions 120. A single type of a server module 130 is placed between the two partitions 120. For example, as illustrated in FIGS. 1A and 1B, the first type sever module 131 is placed between the two partitions 120. Alternatively, other types of the server module 130, such as any of the second type server modules 132, can be placed between the two partitions 120.

The server chassis 100 further includes two levers 140 mounted to the base 110. The base 110 includes a first side wall 111 and a second side wall 112 that is parallel to the first side wall 111. The partitions 120 are positioned between the first side wall 111 and the second side wall 112. Because the widths of the two second type server modules 132 are the same, the distance B between the first side wall 111 and one of the partitions 120 is generally the same as distance B between the second side wall 112 and the other one of the partitions 120, as indicated in FIG. 1B. Thus, one second type server module 132 is positioned at a space between the first side wall 111 and the one of the partitions 120, and the other second type sever module 132 is positioned at a space between the second side wall 112 and the other one of the partitions 120. As exemplified in FIGS. 1A and 1B, the width of the first type server module 131 is different from or greater than the width of the second type server module 132. Further, a space with distance A between the two partitions 120 accommodating the first type server module 131 is different from or greater than the space with distance B between the first side wall 111 and one of the partitions 120. The space with distance A is also different from or greater than the space with distance B between the second side wall 112 and the other one of the partitions 120.

One of the two levers 140 is coupled to the first side wall 111, and another one of the two levers 140 is coupled to the second side wall 112. The two levers 140 are configured to be coupled with or uncoupled from the two partitions 120. In FIG. 1A, the levers 140 are coupled with the two partitions 120 to secure the server modules 130 installed within the server chassis 100. At least one of the levers 140 includes an adjustable arm 141. In FIGS. 1A and 1B, both levers 140 include the adjustable arm 141. However, in some embodiments, only one of the levers 140 includes the adjustable arm 141. The adjustable arm 141 of the lever 140 has a first arm 142 and a second arm 143. The first arm 142 may be a fixed arm. The second arm 143 is movably coupled to the first arm 142. Thus, the adjustable arm 141 has a length that is changeable based on a position of the second arm 143 relative to the first arm 142. A hook structure 144 is coupled to the second arm 143. For example, the hook structure 144 is coupled to one end of the second arm 143. The hook structure 144 may be pivotably coupled to the second arm 143. The hook structure 144 is configured to engage with a receiving portion 503 (see FIG. 5) of a corresponding one of the partitions 120.

It is noted that both adjustable arms 141 of the levers 140 are in a first or shortened configuration in FIG. 1A. The levers 140 in the first or shortened configuration are coupled with the at least two partitions 120 when a distance between the at least two partitions 120 is first distance A. When the levers 140 are set in the first or shortened configuration, the second arm 143 is positioned at a first position with respect to the first arm 142. More detailed structure of the lever 140 will be discussed, referring to FIG. 3.

Figure 2A:
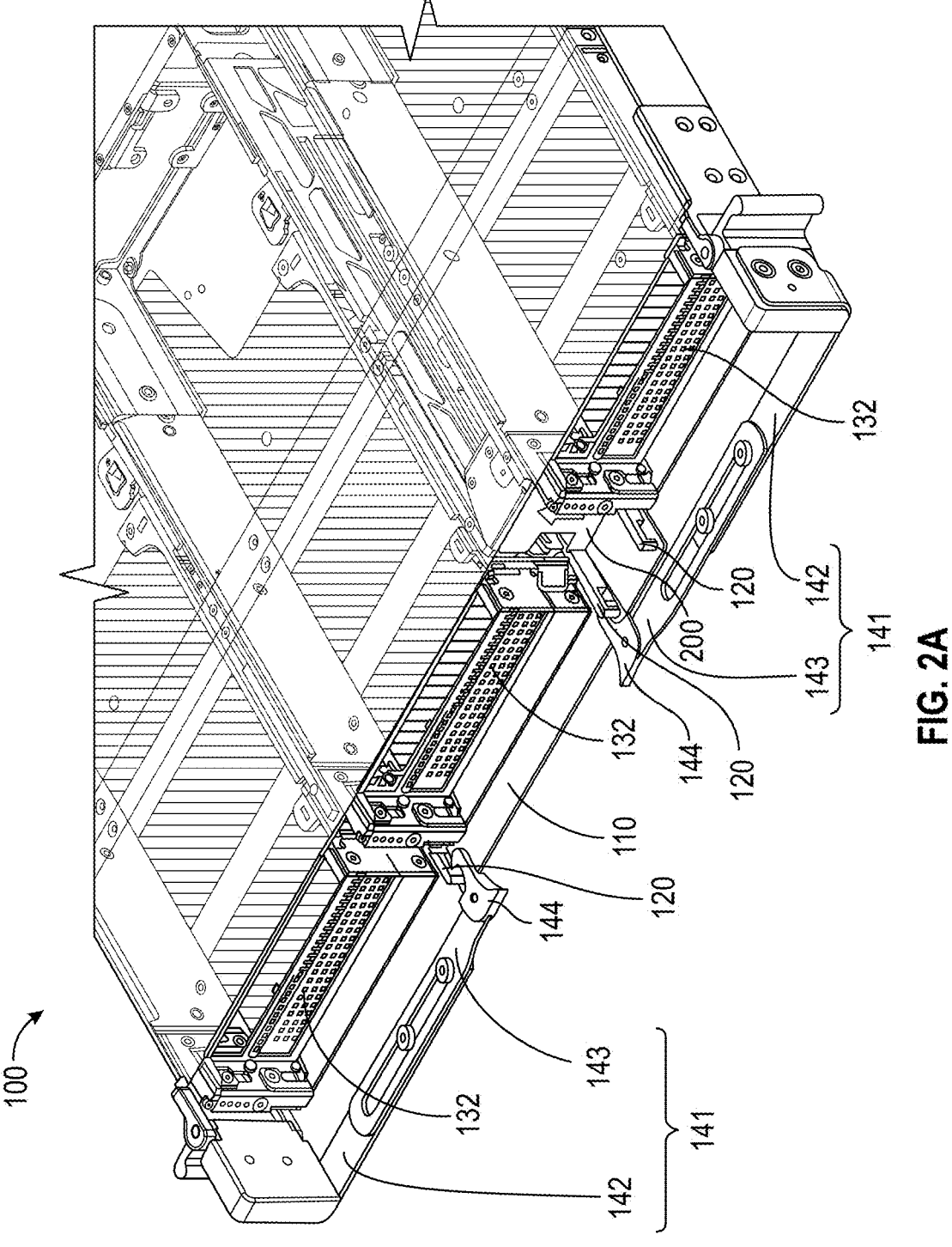
FIG. 2A is a generally perspective partial view of a server chassis housing various components, according to certain aspects of the present disclosure.
Figure 2B:
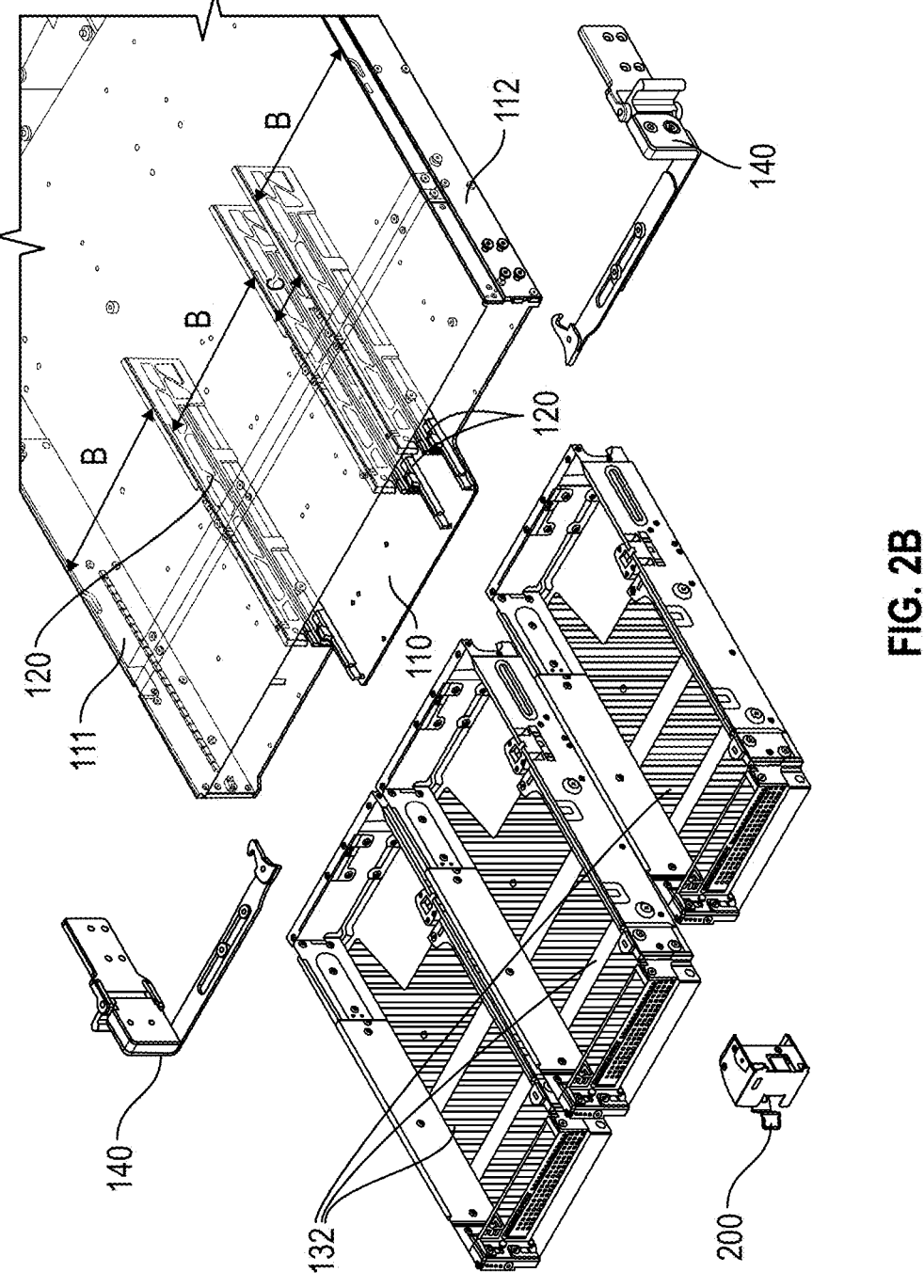
FIG. 2B is an exploded view of the server chassis and various components shown in FIG. 2A, according to certain aspects of the present disclosure.

Referring to FIGS. 2A and 2B, a server chassis 100 is in a configuration that is different from the configuration of the server chassis 100 shown in FIGS. 1A and 1B. That is, in contrast to the server chassis 100 shown in FIGS. 1A and 1B, which has two different types of server modules 130 (131, 132), all three sever modules 130 installed within the server chassis 100 are the same first type server modules 132 in FIGS. 2A and 2B. Further, compared to the server chassis 100 shown in FIGS. 1A and 1B, an additional partition 120 is present in the server chassis 100 shown in FIGS. 2A and 2B. That is, there are two partitions 120 shown in FIGS. 1A and 1B, and there are three partitions 120 shown in FIGS. 2A and 2B. The additional partition 120 shown in FIGS. 2A and 2B is positioned between the two partitions 120 shown in FIGS. 1A and 1B. Thus, three generally same-sized spaces with distance B are formed to accommodate three same-sized or identical second type server modules 132. Arrangements of the two or three partitions 120 within the server chassis 100 will be discussed further at FIGS. 7A-7H.

In FIGS. 2A and 2B, a space filler module 200 is positioned between two partitions 120. The additional partition 120 is positioned between the two partitions 120 to accommodate the second type server module 132 instead of the first type server module 131 shown in FIG. 1A. Since the width of the second type server module 132 is less than the width of the first type server module 131, an extra open space is generated, if the second type server module 132 is positioned in the space with distance A between the two partitions 120 shown in FIGS. 1A and 1B. To accommodate the width of the second type server module 132, the additional partition 120 is added such that the second type server module 132 can be properly fitted between the two partitions 120, including the additional partition 120. Therefore, an open space with distance C is generated between the additional partition 120 and one of the pre-existing partitions 120, as shown in FIG. 2B. The space filler module 120 is placed at the open space with distance C, as shown in FIG. 2A, so that no opening exists on the front panel of the sever modules 130. There may be various sizes of space filler modules available so that an appropriately sized space filler module 200 can be used based on a size of an open space generated by differently arranged partitions 120. Sizes or widths of the first type server module 131, second type server module 132, and space filler module 200 will be discussed further at FIGS. 6A-6C.

Further, compared to the server chassis 100 shown in FIGS. 1A and 1B, an additional difference of the server chassis 100 shown in FIGS. 2A and 2B is that one of the adjustable arms 141 (the adjustable arm on the right side in the drawings) is in a second or extended configuration while both adjustable arms 141 shown in FIG. 1A are in the first or shortened configuration. See the difference between the adjustable arm 141 of the lever 140 on the left side which is in the first configuration, and the adjustable arm 141 of the lever 140 on the right side which is in the second configuration in FIGS. 2A and 2B.

At least one lever 140 is set in the second or extended configuration when the levers 140 are coupled with the at least two partitions 120 and when a distance between the at least two partitions 120 is second distance B. The first distance A shown in FIG. 1B is greater than the second distance B shown in FIG. 2B. The second arm 143 is positioned at a second position with respect to the first arm 142 when the at least one of the levers 140 is set in the second or extended configuration. A first length of the at least one of the levers 140 set in the first configuration, as shown in FIGS. 1A and 1B, is shorter than a second length of the at least one of the levers 140 set in the second configuration, as shown in FIGS. 2A and 2B.

Figure 3A:
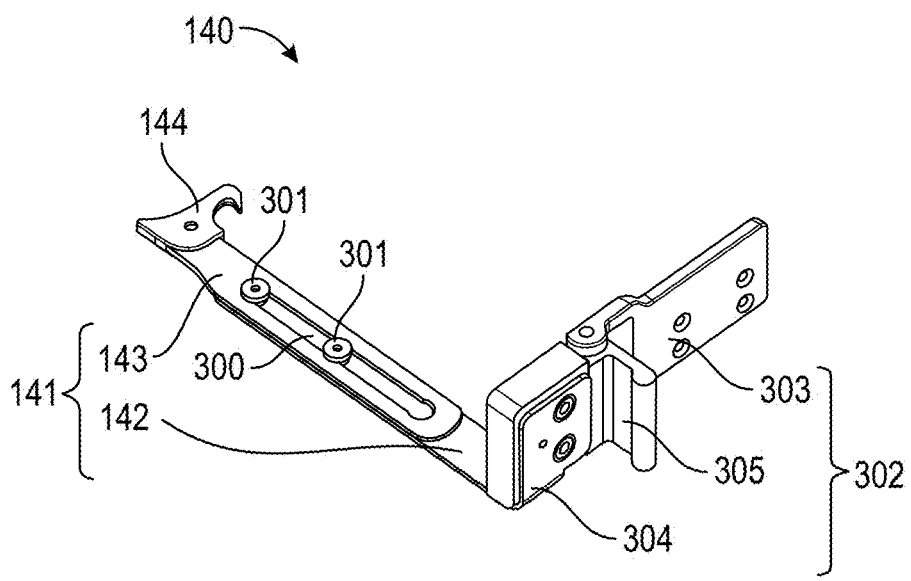
FIG. 3A is a generally perspective view of an adjustable lever, according to certain aspects of the present disclosure.
Figure 3B:
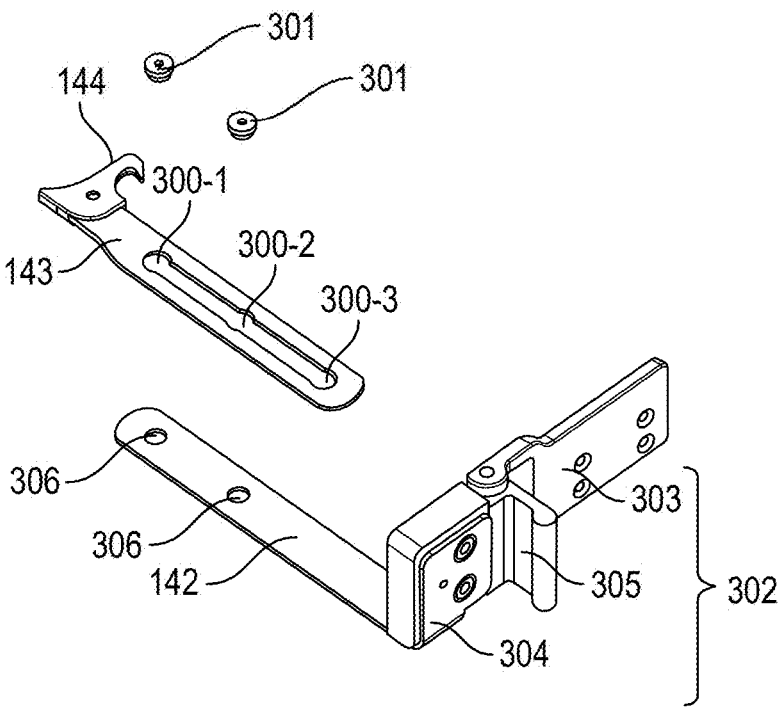
FIG. 3B is an exploded view of the adjustable lever shown in FIG. 3A, according to certain aspects of the present disclosure.
Figure 4:
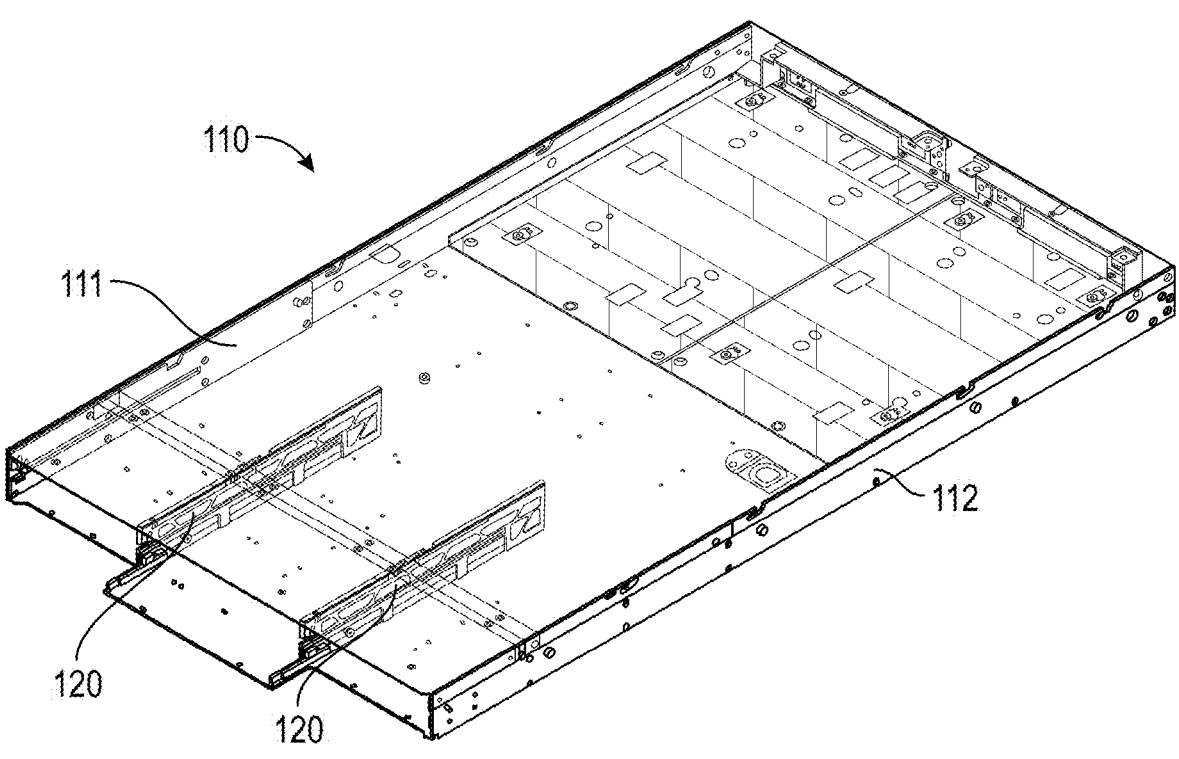
FIG. 4 is a generally perspective view of a base, according to certain aspects of the present disclosure.

Referring to FIGS. 3A and 3B, an adjustable lever 140 includes a lever base 302 coupled to the first or second side wall 111 or 112 (shown in FIGS. 1A, 2A, and 4). In general, the lever 140 includes metal parts. The lever base 302 includes a fixed portion 303 coupled to the first or second side wall 111 or 112 of the base 110. The lever base 302 further includes a movable portion 304 pivotably coupled to the fixed portion 303. A first arm 142 is coupled to the movable portion 304 such that an adjustable arm 141 and the movable portion 304 move together. The adjustable arm 141 includes the first arm 142 and a second arm 143. The first arm 142 is also coupled to the second arm 143. A hook structure 144 is coupled to one end of the second arm 143. The hook structure 144 may be pivotably coupled to the second arm 143. The hook structure 144 is configured to engage with a receiving portion 503 (shown in FIG. 5) of a partition 120. In some embodiments, the hook structure 144 is made of plastic or metal.

The lever base 302 further includes a tab 305 extending from the movable portion 304. The tab 305 is configured to receive a user input for moving the adjustable arm 141 such that the levers 140 are engaged with or disengaged from respective partitions 120 in response to movement of the adjustable arm 141. In FIGS. 3A and 3B, the lever 140 is in the first or shortened configuration as the levers 140 shown in FIGS. 1A and 1B.

An elongated slit 300 is formed on the second arm 143. At least two spring locks 301 pass through the slit 300 and are coupled to the first arm 142. There are at least two through holes 306 formed on the first arm 142 to receive the at least two spring locks 301. Thus, the spring lock 301 may be elastically coupled to the first arm 142 and the second arm 143, allowing up-and-down and back-and-forth movements of the second arm 143 relative to the first arm 142. Generally, the first arm 142 and the second arm 143 are closely coupled by the pressure generated by the spring lock 301 such that the second arm 143 would not move relative to the first arm 142 unless an external input is applied to the second arm 143. A user input may be applied to the second arm 143 to move the second arm 143 relative to the first arm 142. The user input may include raising the second arm 143 upward relative to the first arm 142, and then sliding the second arm 143 relative to the first arm 142. In some embodiments, the user may pull or push the second arm 143 to move the second arm 143 relative to the first arm 142. The position of the slit 300 is changed with respect to the spring locks 301, according to the movement of the second arm 143 relative to the first arm 142. In some embodiments, the slit 300 has a number of stopping positions 300-1, 300-2, 300-3 at which the spring locks 301 are positioned. For example, the number of the stopping positions on the slit 300 is three, as exemplified in FIG. 3B. However, the number of the stopping positions 300-1, 300-2, 300-3 is not limited to three, and the number may be two or more than three. Each of the stopping positions 300-1, 300-2, 300-3 may be shaped to receive a head portion of the spring lock 301 which has a round shape. In FIG. 3A, the pair of spring locks 301 is positioned at two stopping positions 300-1, 300-2 such that the lever 140 is in the first or shortened configuration. As exemplified in FIG. 2A. when the pair of spring locks 301 is positioned at two stopping positions 300-2, 300-3, the lever 140 is in the second or extended configuration. When the lever 140 is in the second or extended configuration, the length of the adjustable arm 141 is longer than the length of the adjustable arm 141 of the lever 140 that is in the first or shortened configuration.

Referring to FIG. 4, a base 110 houses various modules and components of a server. In general, the base 110 is made of metal. The base 110 includes a first side wall 111 and a second side wall 112. At least two partitions 120 are positioned between the first side wall 111 and the second side wall 112. A number of the partitions 120 may vary depending on a number or sizes/widths of server modules 130 received in the server chassis 100. The number of the partitions 120 may be two, three, or four, but the number is not limited thereto.

Figure 5:
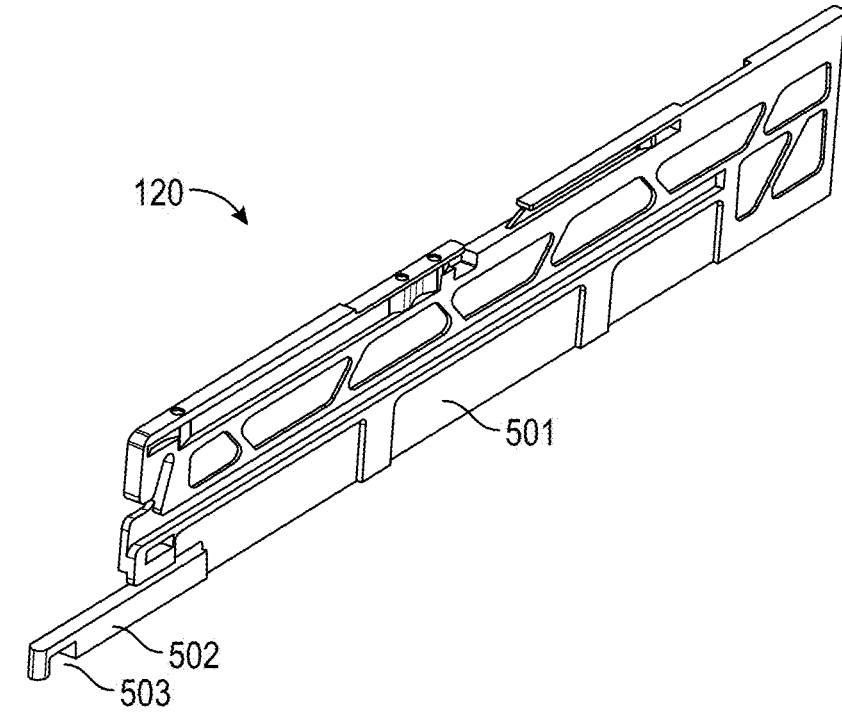
FIG. 5 is a generally perspective view of a partition, according to certain aspects of the present disclosure.

Referring to FIG. 5, a partition 120 includes a main panel 501 and a leg 502 coupled to the main panel 510. In general, the partition 120 is made of metal and used to separate front panel modules of a server. The leg 502 includes a receiving portion 503 configured to engage with a hook structure 144 of a lever 140. The partition 120 is configured to be coupled to the base 110, as shown in FIG. 4. When the partition 120 is coupled to the base 110, a slot is formed to receive a server module 130. A slot may be formed between two partitions 120; between a partition 120 and a first side wall 111 of the base 110; and/or between a partition 120 and a second side wall 112 of the base 110. The slot is configured to receive a server module 130.

Figures 6A, 6B, 6C:
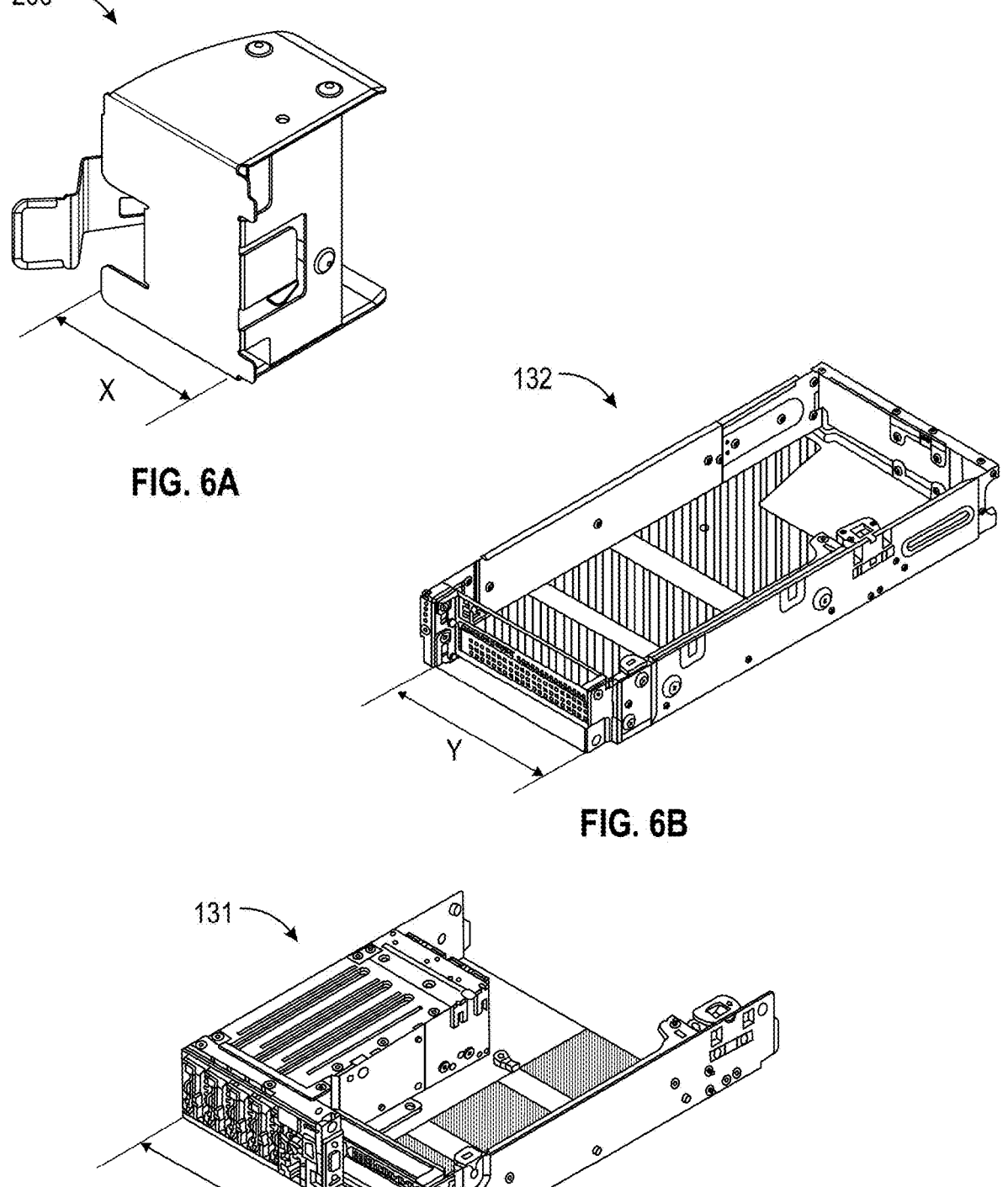
FIG. 6A is a generally perspective view of a first type of front panel module, according to certain aspects of the present disclosure.
FIG. 6B is a generally perspective view of a second type of front panel module, according to certain aspects of the present disclosure.
FIG. 6C is a generally perspective view of a third type of front panel module, according to certain aspects of the present disclosure.

Referring to FIGS. 6A-6C, front panel modules of a server that can be installed within the server chassis 100 include a space filler module 200, a second type server module 132, and a first type server module 131. However, the front panel modules are not limited to the space filler module 200, second type server module 132, and first type server module 131 exemplified in the present disclosure.

Additional or alternative modules may be included in the front panel modules. Based on the usage of the server, different modules can be installed within the server chassis 100 to meet various needs. In general, the front panel modules are made of metal.

The space filler module 200 shown in FIG. 6A is also shown in FIGS. 2A and 2B. The second type server module 132 shown in FIG. 6B is also shown in FIGS. 1A-2B. The first type server module 131 shown in FIG. 6C is also shown in FIGS. 1A and 1B. For example, a width of the space filler module 200 is X, a width of the second type server module 132 is Y, and a width of the first type server module 131 is Z. Y is greater than X, and Z is greater than Y. In some embodiments, the sum of X and Y is generally equal or similar to Z, or the sum of X and Y is a little (about 0.5 millimeter (mm), about 1 mm, about 1.5 mm, about 2 mm, about 2.5 mm, or about 3 mm) less than Z. The server chassis 100 is capable of receiving any combination of the front panel modules 200, 132, and/or 131, using the adjustable lever 140 without replacing the lever 140. In general, the widths X, Y, Z correspond to distances C, B, and A, respectively, as shown in FIGS. 1B and 2B. The received combination of the front panel modules 200, 132, and/or 131 can be secured by the lever 140, of which the length is adjusted to engage with the partitions 120 set up to accommodate the front panel modules 200, 132, and/or 131.

Figure 7A:
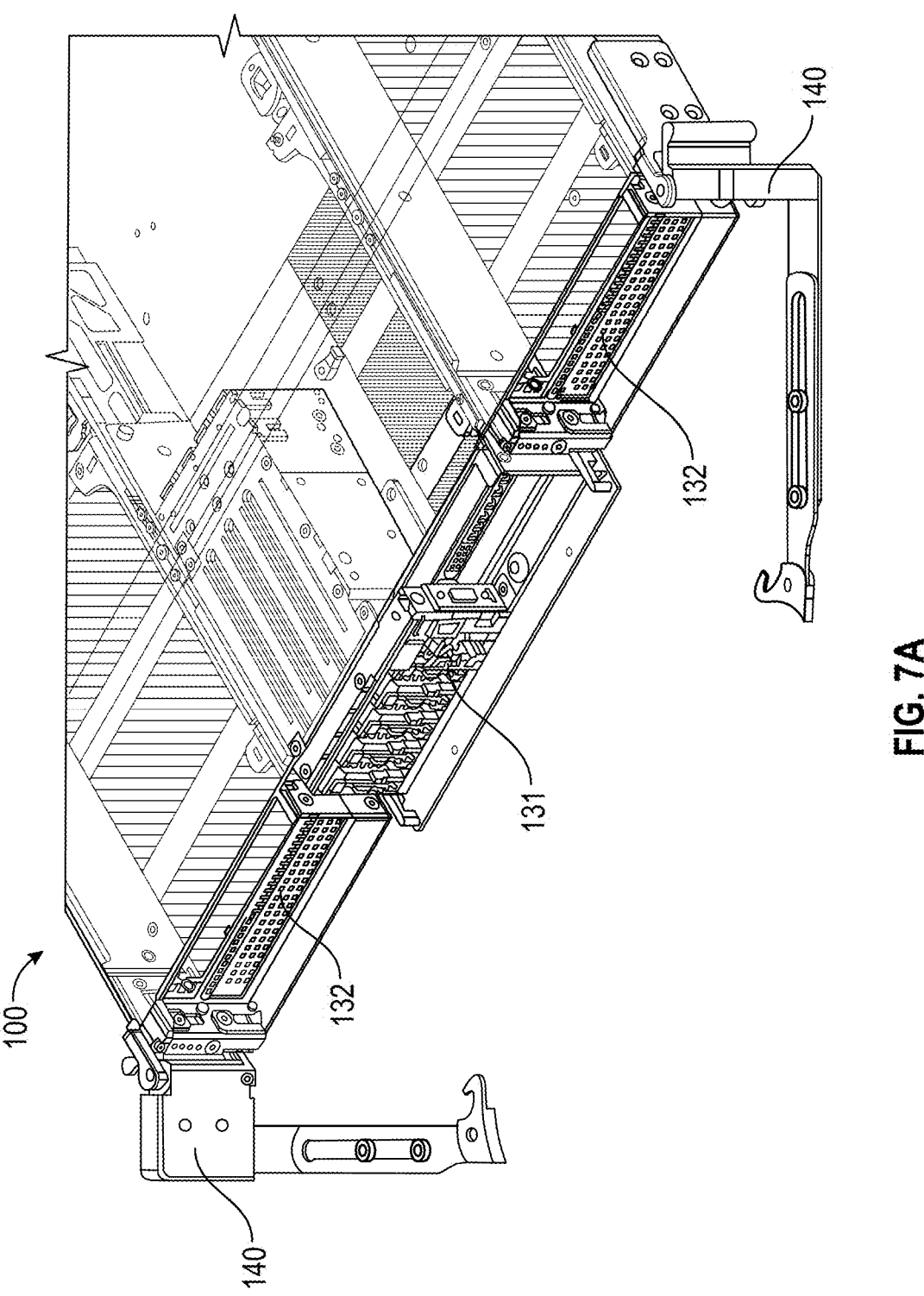
FIGS. 7A-7I illustrate stepwise operation of levers when a server module of a server chassis is replaced with a different server module, according to certain aspects of the present disclosure.
Figure 7B:
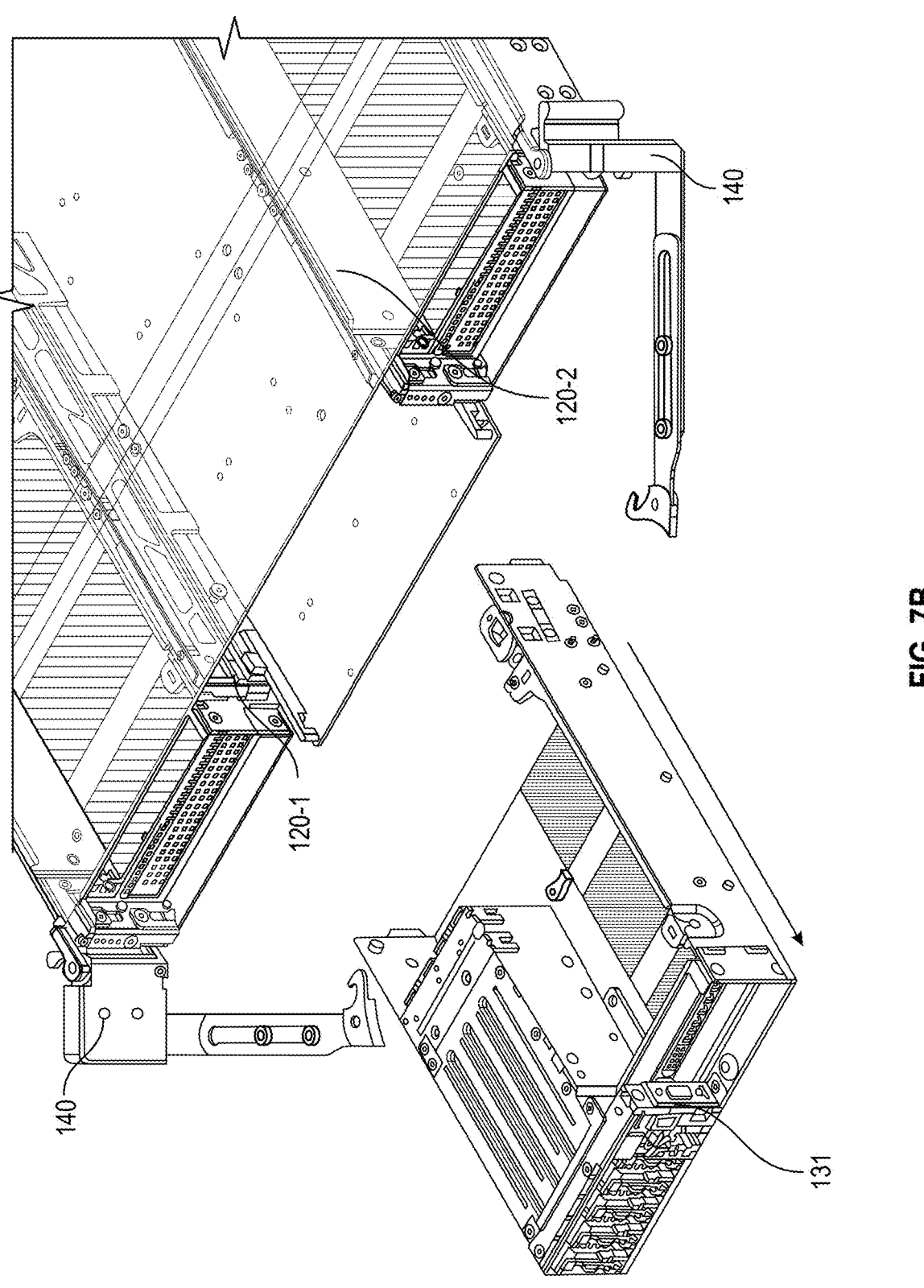
Figure 7C:
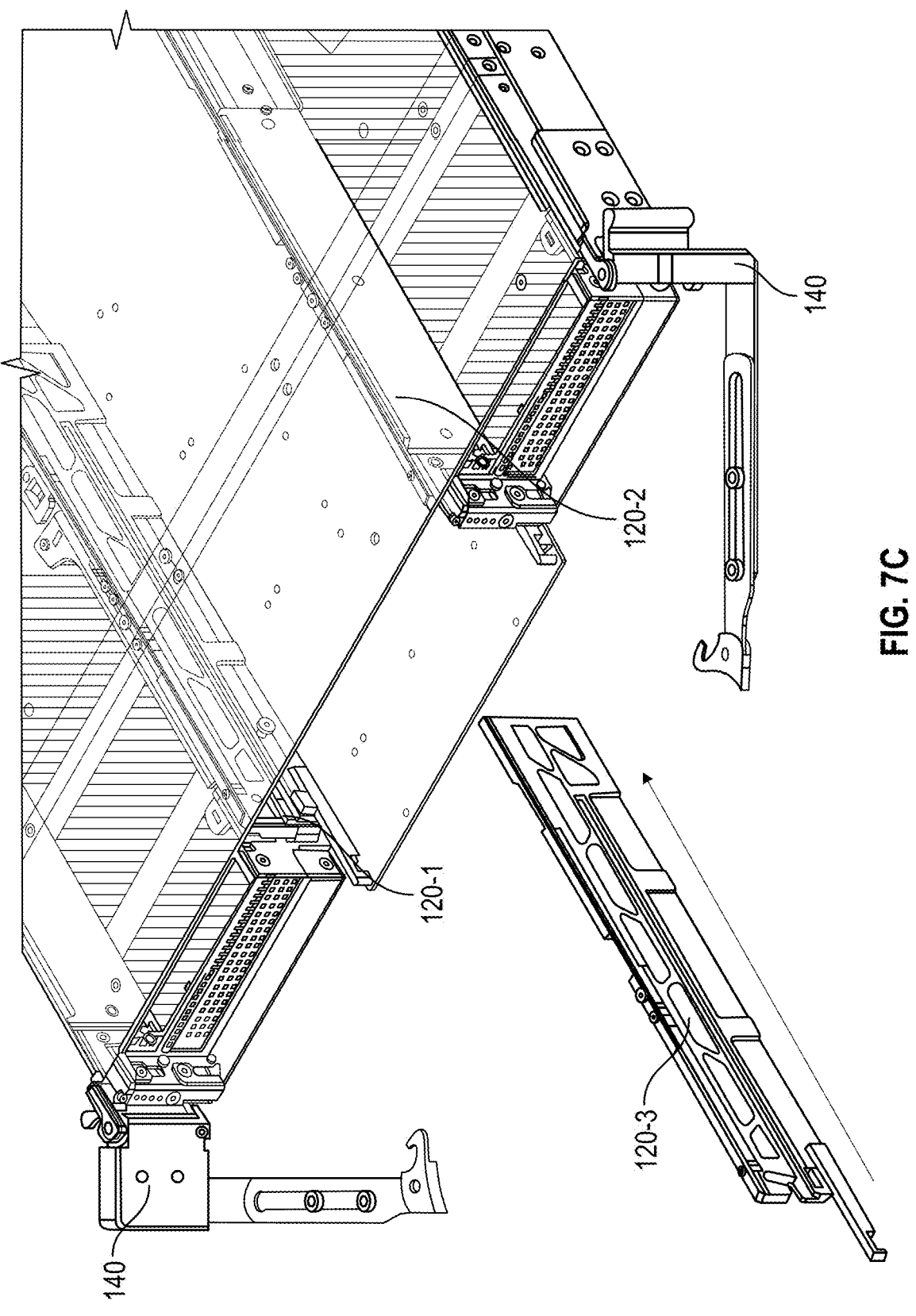
Figure 7D:
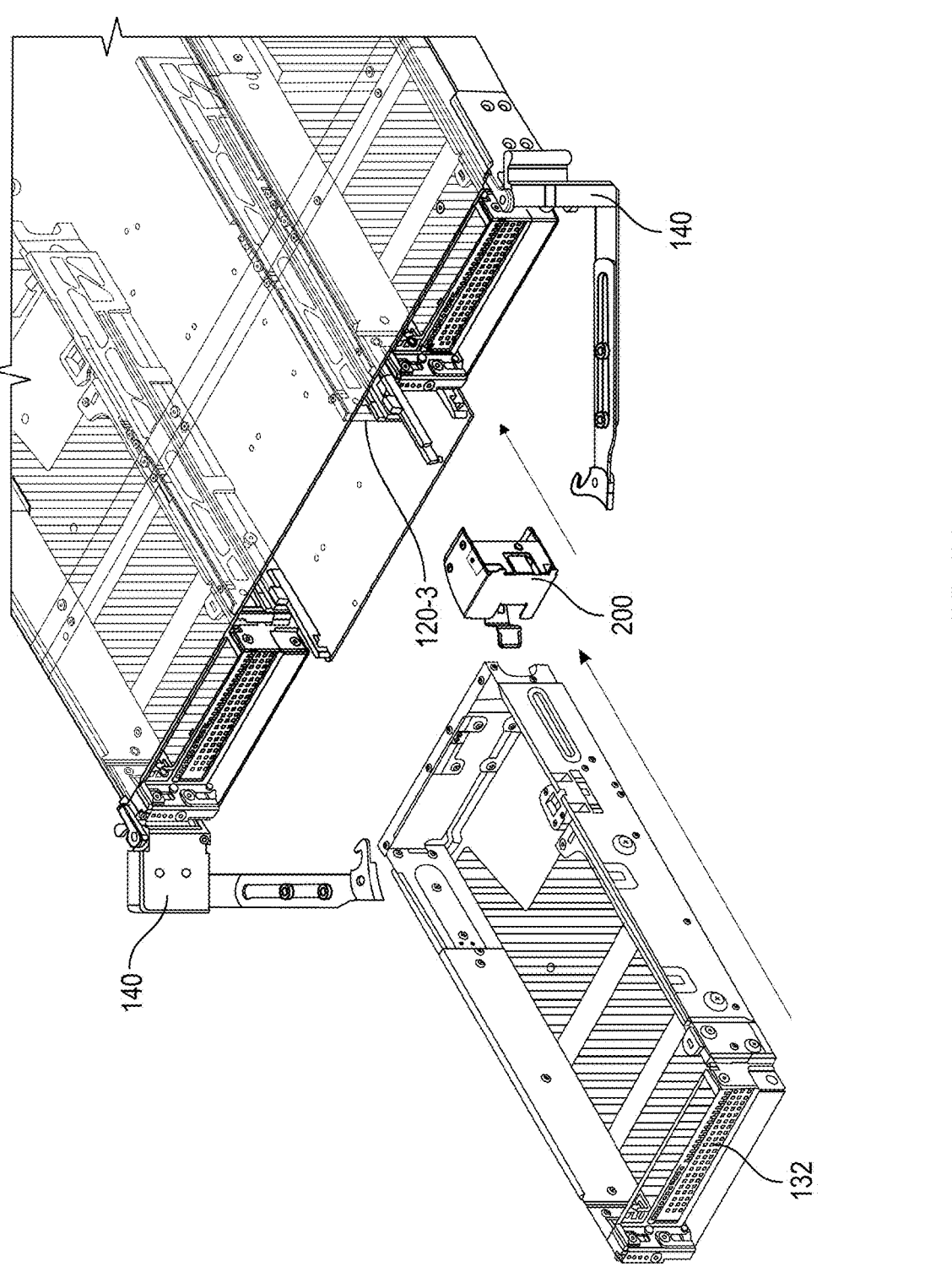
Figures 7E, 7F:
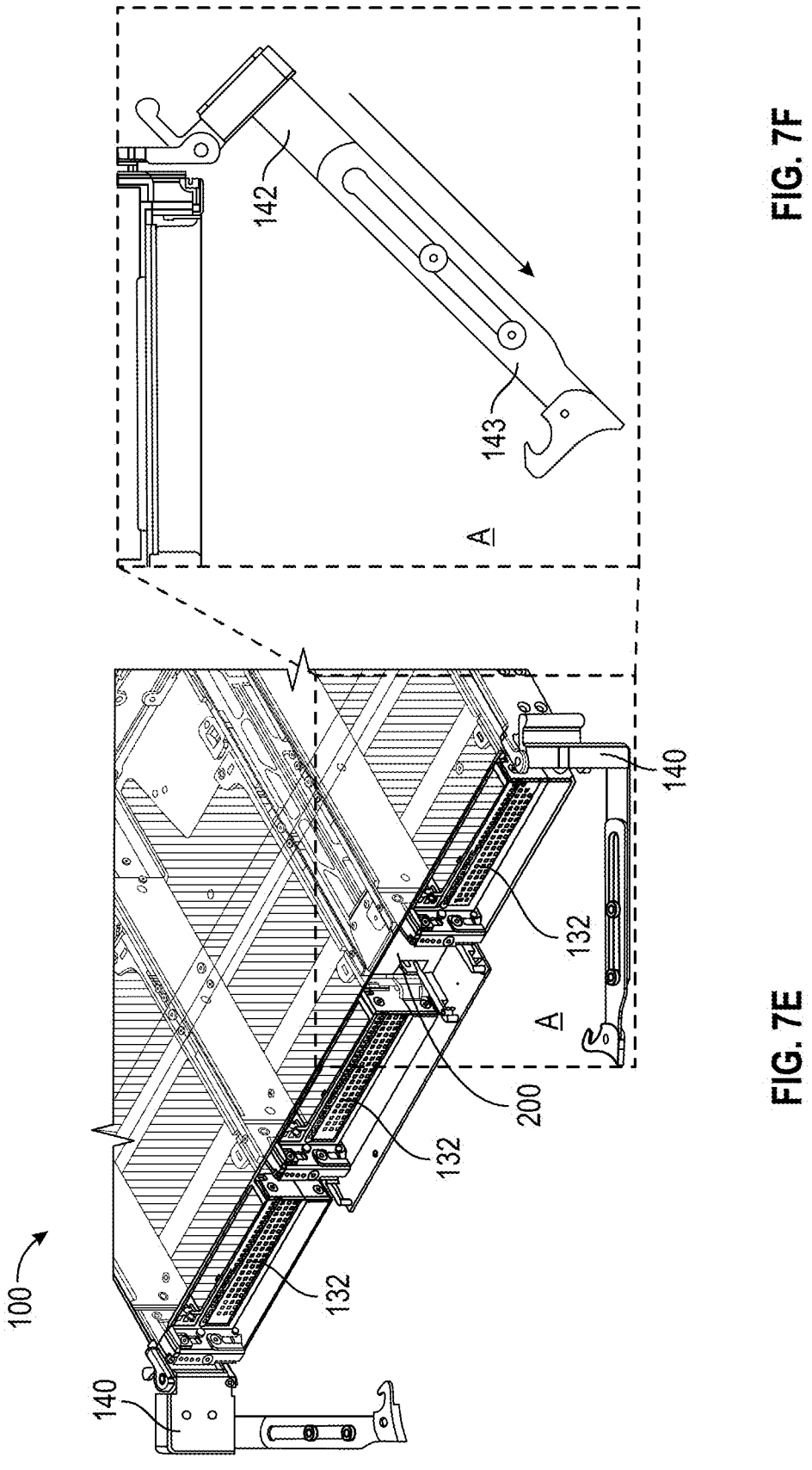
Figures 7G, 7H:
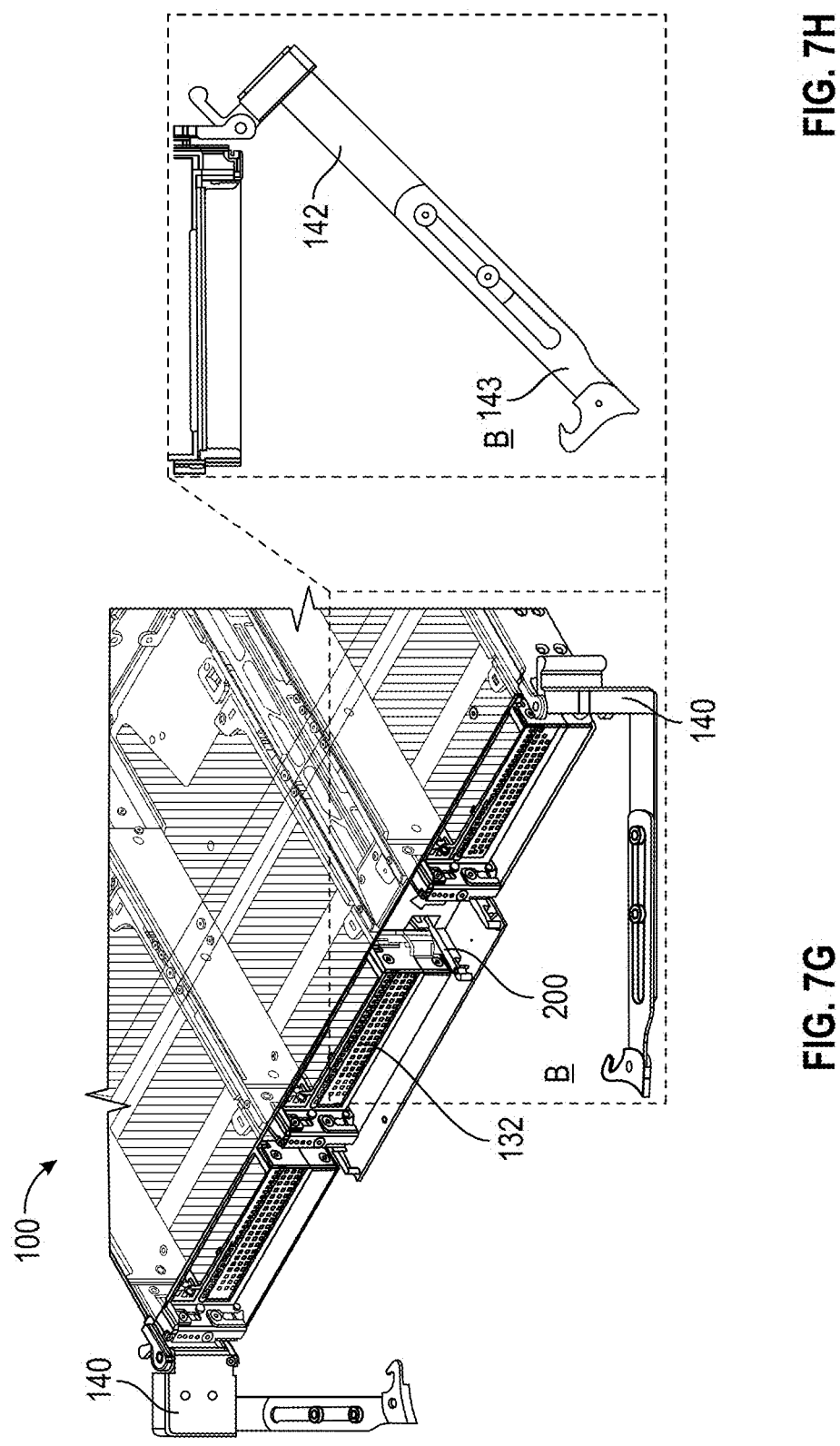
Figure 7I:
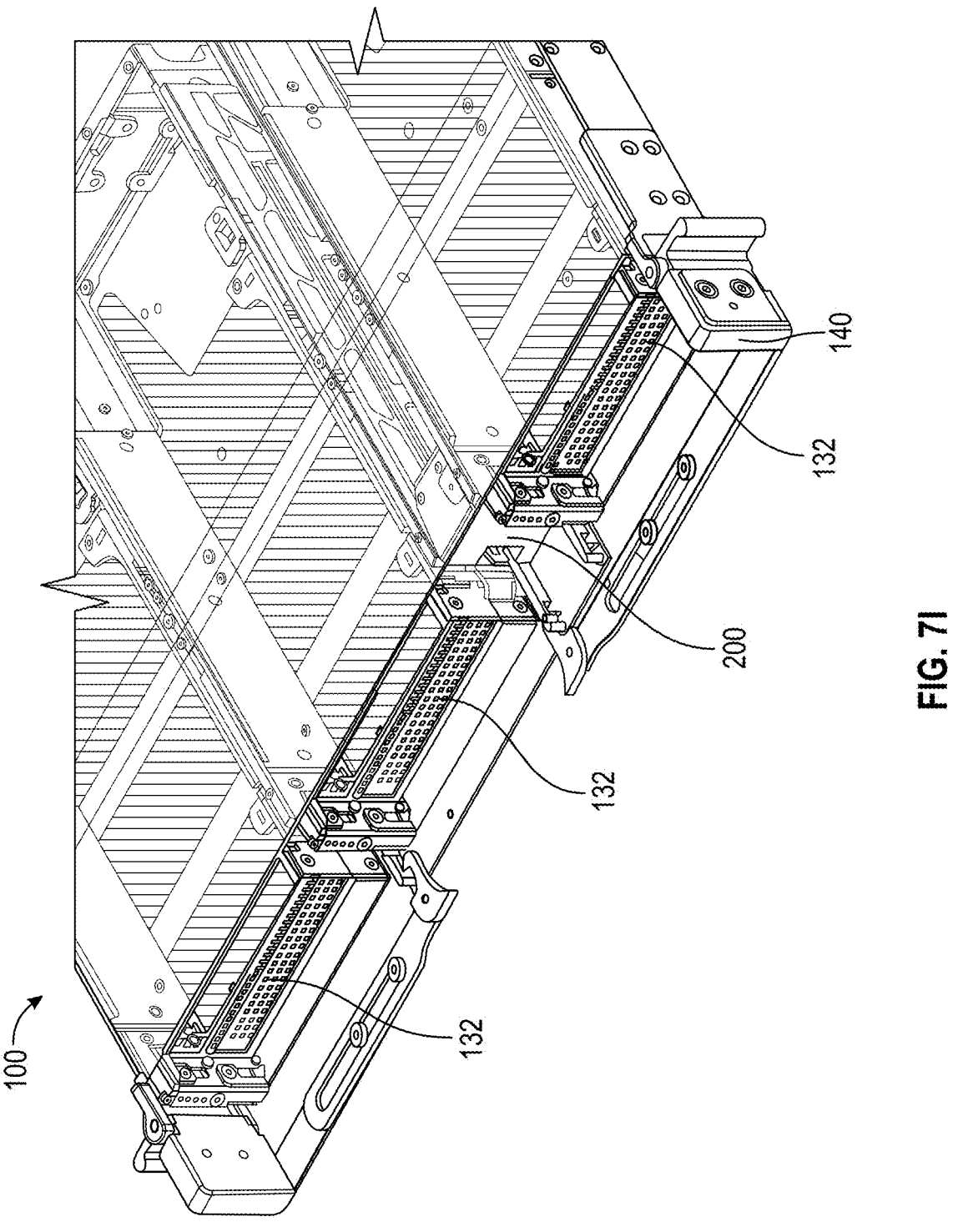

Referring to FIGS. 7A-7I, a mechanism of an adjustable lever and a method of replacing a server module in a server chassis are described. First, referring to FIG. 7A, the levers 140, which were in a closed configuration, as shown in FIG. 1A, are opened or disengaged from the partitions 120-1, 120-2. For example, the levers 140 are opened in response to user input received via the tabs 305 (shown in FIGS. 3A and 3B) of the levers 140. Once the levers 140 are open, the first type sever module 131 is pulled out of the server chassis 100, as shown in FIG. 7B. Then, an additional partition 120-3 is inserted into the server chassis 100, as shown in FIG. 7C. Once the inserted partition 120-3 is coupled to the base 110 to generate distance B between the partitions 120-1, 120-3, a second type server module 132 is inserted into the server chassis 100, as shown in FIG. 7D. Further, a space filler module 200 is also inserted into the server chassis 100. The inserted second type server module 132 is positioned between the partitions 120-1, 120-3, and the inserted space filler module 200 is positioned between the partitions 120-2 and 120-3, as shown in FIG. 7E. Referring to area A shown in FIGS. 7E and 7F, the adjustable lever 140/arm 141 is still in the first or shortened configuration and needs to be adjusted to engage with differently arranged partitions 120-1, 120-3. Referring to area B shown in FIGS. 7G and 7H, the second arm 143 is extended from the first arm 142 by being pulled outward to be placed in a second or extended configuration. Then, the extended lever 140 engages with the partition 120-3, as shown in FIG. 7I, to be placed in a closed configuration. As shown in FIG. 7I, the other lever 140 has not been adjusted and remains in the first or shortened configuration to engage with the partition 120-1. In particular, a hook structure 144 (shown in FIGS. 3A and 3B) of the lever 140 engages with a receiving portion 503 (shown in FIG. 5) of the partition 120. Thus, the second type server module 132 replacing the first type server module 131 is secured by the levers 140 including the adjusted lever 140. In some embodiments, both levers 140 may be adjusted or the other one of the levers 140 may be adjusted to engage with differently arranged partitions 120-1, 120-2, and/or 120-3.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A server chassis comprising:
a base having at least two partitions and configured to receive a server module between the at least two partitions; and
two levers mounted to the base, the two levers being configured to be coupled with or uncoupled from the at least two partitions, at least one of the two levers including an adjustable arm having a first arm and a second arm, the second arm being movably coupled to the first arm, the adjustable arm having a length that is changeable based on a position of the second arm relative to the first arm.

2. The server chassis of claim 1, wherein the base includes a first side wall and a second side wall that is parallel to the first side wall, the at least two partitions being positioned between the first side wall and the second side wall, one of the two levers being coupled to the first side wall and another one of the two levers being coupled to the second side wall.

3. The server chassis of claim 2, wherein the at least one of the two levers further includes:
a lever base coupled to the first or second side wall of the base; and
a hook structure coupled to the second arm, and
wherein the first arm is coupled to the lever base.

4. The server chassis of claim 3, wherein the lever base includes a fixed portion coupled to the first or second side wall of the base.

5. The server chassis of claim 4, wherein the lever base further includes a movable portion pivotally coupled to the fixed portion, the first arm being coupled to the movable portion such that the adjustable arm and the movable portion move together.

6. The server chassis of claim 5, wherein the lever base further includes a tab extending from the movable portion, the tab being configured to receive a user input for moving the adjustable arm such that the two levers are engaged with or disengaged from respective partitions in response to movement of the adjustable arm.

7. The server chassis of claim 3, wherein the hook structure is pivotally coupled to the second arm.

8. The server chassis of claim 7, wherein the hook structure is configured to engage with a receiving portion of a corresponding one of the at least two partitions.

9. The server chassis of claim 1, wherein a distance between the at least two partitions is changeable to accommodate the server module received in the base based on a width of the server module.

10. The server chassis of claim 9, wherein the distance is a first distance when the server module is a first type server module, and the distance is a second distance when the server module is a second type server module, the first distance being greater than the second distance, the first type server module having a different size than the second type server module.

11. The server chassis of claim 10, wherein the at least one of the two levers is set in a first configuration when the two levers are coupled with the at least two partitions and when the distance is the first distance.

12. The server chassis of claim 11, wherein the second arm is positioned at a first position with respect to the first arm when the at least one of the two levers is set in the first configuration.

13. The server chassis of claim 12, wherein the at least one of the two levers is set in a second configuration when the two levers are coupled with the at least two partitions and when the distance is the second distance.

14. The server chassis of claim 13, wherein the second arm is positioned at a second position with respect to the first arm when the at least one of the two levers is set in the second configuration.

15. The server chassis of claim 14, wherein a first length of the at least one of the two levers set in the first configuration is shorter than a second length of the at least one of the two levers set in the second configuration.

16. A server comprising:
a base having at least two partitions and configured to receive a server module between the at least two partitions, wherein a distance between the at least two partitions is a first distance when the server module is a first type server module, and the distance is a second distance when the server module is a second type server module, the first distance being greater than the second distance; and
two levers coupled to the base and configured to be coupled with or uncoupled from the at least two partitions, each of the at least two partitions having a receiving portion configured to engage with a hook structure of a corresponding one of the two levers,
wherein at least one of the two levers includes an adjustable arm having a first arm and a second arm, the adjustable arm further having a slit, at least two fasteners passing through the slit and coupling the second arm to the first arm,
wherein the second arm is slidingly movable with respect to the first arm, and
wherein a length of the adjustable arm is changeable based on relative movement between the first arm and the second arm.

17. The server of claim 16, wherein the at least one of the two levers is set in a first configuration when the two levers are coupled with the at least two partitions and when the distance is the first distance.

18. The server of claim 17, wherein the second arm is positioned at a first position with respect to the first arm when the at least one of the two levers is set in the first configuration.

19. The server of claim 18, wherein the at least one of the two levers is set in a second configuration when the two levers are coupled with the at least two partitions and when the distance is the second distance.

20. The server of claim 19, wherein the second arm is positioned at a second position with respect to the first arm when the at least one of the two levers is set in the second configuration, and wherein a first length of the at least one of the two levers set in the first configuration is shorter than a second length of the at least one of the two levers set in the second configuration.

* * * * *